United States Patent
Wang et al.

(10) Patent No.: US 8,623,680 B2
(45) Date of Patent: Jan. 7, 2014

(54) LED CHIP PACKAGE STRUCTURE USING SEDIMENTATION AND METHOD FOR MAKING THE SAME

(75) Inventors: Bily Wang, Hsinchu (TW); Shih-Yu Wu, Taipei County (TW); Chao-Yuan Huang, Tai Chung (TW); Ping-Chou Yang, Taipei County (TW); Cheng-Yen Chiang, Hsinchu (TW)

(73) Assignee: Harvatek Corporation, Hsinchu (TW)

( * ) Notice: Subject to any disclaimer, the term of this patent is extended or adjusted under 35 U.S.C. 154(b) by 294 days.

(21) Appl. No.: 13/232,391

(22) Filed: Sep. 14, 2011

(65) Prior Publication Data
US 2012/0003765 A1 Jan. 5, 2012

Related U.S. Application Data

(62) Division of application No. 12/457,222, filed on Jun. 4, 2009, now abandoned.

(30) Foreign Application Priority Data
Jul. 11, 2008 (TW) .............................. 97126479 A

(51) Int. Cl.
*H01L 21/00* (2006.01)
(52) U.S. Cl.
USPC ................................... 438/29; 257/E33.061

(58) Field of Classification Search
USPC .................................. 257/E33.056, E33.061
See application file for complete search history.

(56) References Cited

U.S. PATENT DOCUMENTS

| | | | | |
|---|---|---|---|---|
| 2008/0149960 A1* | 6/2008 | Amo et al. | ...................... | 257/98 |
| 2008/0157113 A1* | 7/2008 | Hayashi | .......................... | 257/98 |
| 2008/0218072 A1* | 9/2008 | Haruna et al. | ................ | 313/506 |
| 2009/0026470 A1* | 1/2009 | Lai et al. | ......................... | 257/98 |
| 2012/0104442 A1* | 5/2012 | Kuo et al. | ....................... | 257/98 |

* cited by examiner

*Primary Examiner* — Daniel Whalen
(74) *Attorney, Agent, or Firm* — Rosenberg, Klein & Lee

(57) ABSTRACT

An LED chip package structure using sedimentation includes a package body, at least two conductive substrates, at least one light-emitting element, and a package unit. The package body has a receiving space. The two conductive substrates are received in the receiving space. The light-emitting element is received in the receiving space and electrically connected to the two conductive substrates. The package unit has a package colloid layer and a powder mixed into the package colloid layer, and the package unit is filled into the receiving space. The powder is uniformly deposited in the receiving space by maintaining the package unit at room temperature firstly and the powder is solidified in the receiving space by heating to a predetermined temperature.

12 Claims, 10 Drawing Sheets

LED CHIP PACKAGE STRUCTURE USING SEDIMENTATION AND METHOD FOR MAKING THE SAME

RELATED APPLICATIONS

This application is a Divisional patent application of application Ser. No. 12/457,222, filed on 4 Jun. 2009, now pending. The entire disclosure of the prior application, Ser. No. 12/457,222, from which an oath or declaration is supplied, is considered a part of the disclosure of the accompanying Divisional application and is hereby incorporated by reference.

BACKGROUND OF THE INVENTION

1. Field of the Invention

The present invention relates to an LED chip package structure and a method for making the same, and particularly relates to an LED chip package structure using sedimentation and a method for making the same.

2. Description of Related Art

Referring to FIG. 1, a known LED package structure includes a substrate 1, an LED 2 disposed on the substrate 1, two wires 3, and a colloid layer 4 with phosphor powder 40.

The LED 2 has a light-emitting surface 20 opposite to the substrate 1. The LED 2 has a positive electrode area 21 and a negative electrode area 22 electrically connected to two corresponding positive and negative electrode areas 11, 12 of the substrate 1 via the two 3 respectively. Moreover, the colloid layer 4 with the phosphor powder 40 covers the LED 2 and the two wires 3 for protecting the LED 2. Therefore, when the LED 2 is a blue LED, the blue light generated by the blue LED can pass through the colloid layer 4 with the phosphor powder 40 to generate white light.

However, the phosphor powder 40 does not be uniformly mixed into the colloid layer 4. Hence, when the blue light generated by the blue LED can pass through the colloid layer 4 with the phosphor powder 40 to generate white light, "the condensing capability" and "the color and luster" of the white light are bad and non-uniform.

SUMMARY OF THE INVENTION

One particular aspect of the present invention is to provide an LED chip package structure using sedimentation and a method for making the same. Because the powder of the present invention can be fully deposited on the inner surface of the package body, "the condensing capability" and "the color and luster" of the present invention are good and uniform. In other words, the powder of the present invention can be fully deposited on the inner surface of the package body, so that light generated by the light-emitting elements can pass through the uniform package colloid layer to project uniform light beams out. Hence, the present invention can generate a best light-projecting quality.

In order to achieve the above-mentioned aspects, the present invention provides an LED chip package structure using sedimentation, including: a package body, at least two conductive substrates, at least one light-emitting element, and a package unit. The package body has a receiving space. The two conductive substrates are received in the receiving space. The light-emitting element is received in the receiving space and electrically connected to the two conductive substrates. The powder is uniformly deposited in the receiving space by maintaining the package unit at room temperature firstly and the powder is solidified in the receiving space by heating to a predetermined temperature.

Moreover, the package unit has the following three aspects:
1. First aspect: The package unit has a package colloid layer and a powder mixed into the package colloid layer, and the package unit is filled into the receiving space.
2. Second aspect: The package unit has a package colloid layer with powder and a transparent colloid layer received in the receiving space. The light-emitting element is covered by the package colloid layer with the powder, and the transparent colloid layer is disposed on the package colloid layer in order to protect the package colloid layer.
3. Third aspect: The package unit has a package colloid layer with powder and a transparent colloid layer received in the receiving space. The light-emitting element is covered by the transparent colloid layer, and the package colloid layer is disposed on the transparent colloid layer in order to prevent the quality of the package colloid layer from being affected by heat generated by the light-emitting element.

In order to achieve the above-mentioned aspects, the present invention provides a method for making an LED chip package structure using sedimentation, including: receiving at least one light-emitting element in a receiving space of a package body; electrically connecting the light-emitting element with two conductive substrates that are received in the receiving space; filling a package colloid layer with powder into the receiving space; and maintaining the package colloid layer with the powder at room temperature in order to uniformly depositing the powder in the receiving space.

Moreover, after the step of maintaining the package colloid layer, the method further includes heating the package colloid layer with the powder in order to solidify the package colloid layer with the powder in the receiving space. In addition, the step of heating the package colloid layer is a one-step heating process that includes a heating temperature of 80~150° C. and a heating time of 1~6 hours; Alternatively, the step of heating the package colloid layer is a two-step heating process that includes a first-step heating process and a second-step heating process, the first-step heating process has a heating temperature of 30~100° C. and a heating time of 10~120 minutes, and the second-step heating process has a heating temperature of 80~150° C. and a heating time of 1~6 hours.

Furthermore, after the step of heating the package colloid layer, the method further includes: filling a transparent colloid layer in the receiving space of the package body in order to form the transparent colloid layer on the package colloid layer with the powder; and heating the transparent colloid layer to 80-150° C. during 1-6 hours in order to solidify the transparent colloid layer.

In addition, in another embodiment, before the step of filling the package colloid layer with the powder into the receiving space, the method further includes: filling a transparent colloid layer in the receiving space of the package body in order to cover the light-emitting element; and heating the transparent colloid layer to 80-150° C. during 1-6 hours in order to solidify the transparent colloid layer, wherein the package colloid layer is disposed on the transparent colloid layer.

Therefore, the package colloid layer with the powder is fully deposited firstly, and then the package colloid layer with the powder is heated, in order to make the powder be fully deposited in the receiving space of the package body. Hence, the present invention can prevent non-deposited powder from be solidified in the receiving space of the package body. In addition, the curing time can be decreased, so that the usage life of the package colloid layer with the powder is increased.

Furthermore, the present invention has the following three deposition types according to different light-projecting properties and package structures 1. First type is a single deposition as the first embodiment. The advantage is: the manufacture process is simple.

2. Second type is a dual-layer structure with an inner deposition as the second embodiment. The advantage is: the dual-layer structure has two colloid layers that have the same or different physical property and chemical property such as adhesiveness, hardness or refractive index etc. In addition, the optical quality and the package structure of the second type are good.

3. Third type is a dual-layer structure with an outer deposition as the third embodiment. The advantage is: the package colloid layer is disposed on the transparent colloid layer in order to prevent the quality and the usage life of the package colloid layer from being affected (decreased) by heat generated by the light-emitting element.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
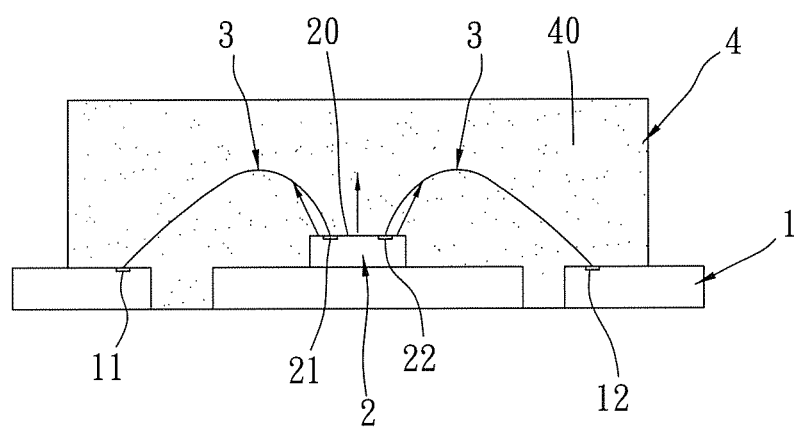
FIG. 1 is a lateral, schematic view of an LED package structure by wire-bounding according to the prior art.
Figure 2:
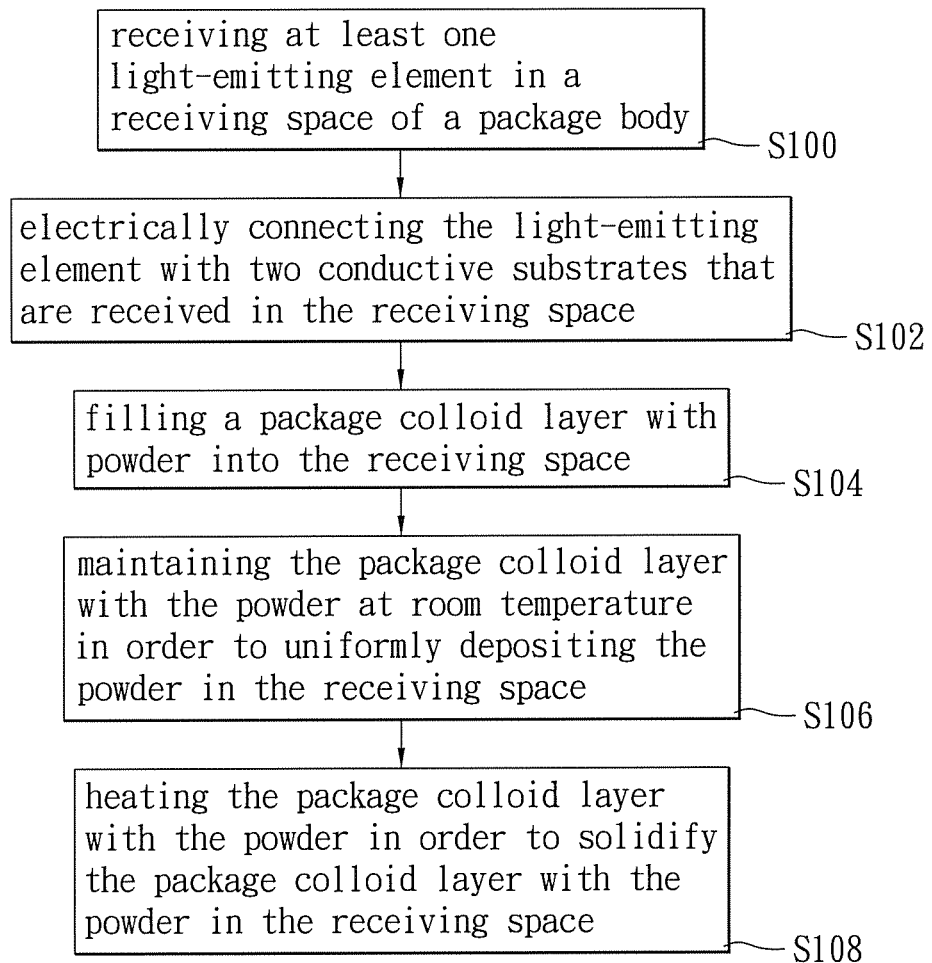
FIG. 2 is a flowchart of a method for making an LED chip package structure using sedimentation according to the first embodiment of the present invention.
Figure 2A:
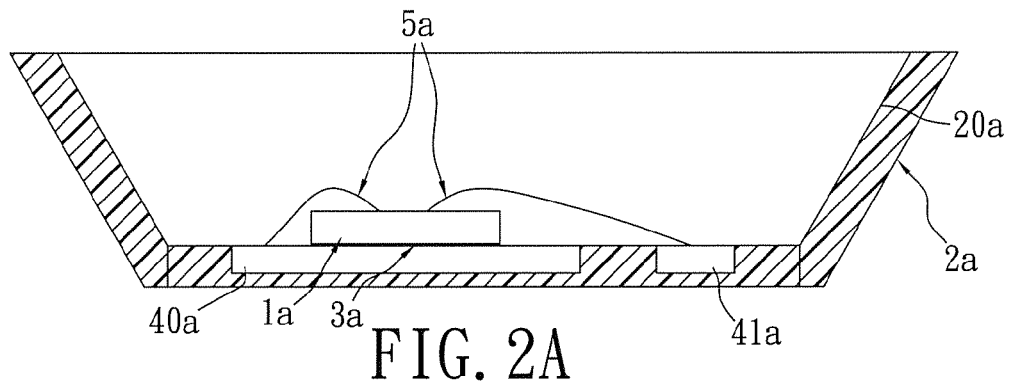
FIGS. 2A to 2C are cross-sectional views of an LED chip package structure using sedimentation according to the first embodiment of the present invention, at different stages of the packaging processes, respectively.

Referring to FIGS. 2 and 2A to 2C, the first embodiment of the present invention provides a method for making an LED chip package structure using sedimentation, including the following steps:

Step S100 is: referring to FIGS. 2 and 2A, receiving at least one light-emitting element 1a in a receiving space 20a of a package body 2a. In the first embodiment, the light-emitting element 1a can be a blue LED, and the package body 2a has a bowl shape. In addition, the light-emitting element 1a is firmly fixed on the inner surface of the bowl-shaped package body 2a via a chip-positioning layer 3a formed between the light-emitting element 1a and the package body 2a. Moreover, the chip-positioning layer 3a is solidified by curing to 155° C. during 3 hours in order to firmly fix the light-emitting element 1a on the inner surface of the bowl-shaped package body 2a.

Step S102 is: referring to FIGS. 2 and 2A, electrically connecting the light-emitting element 1a with two conductive substrates (40a, 41a) that are received in the receiving space 20a. In the first embodiment, at least two lead wires 5a are electrically connected between the light-emitting element 1a and one conductive substrate (positive electrode) 40a and between the light-emitting element 1a and one conductive substrate (negative electrode) 41a. Hence, the positive electrode (not shown) and the negative electrode (not shown) of the light-emitting element 1a are respectively electrically connected with the two conductive substrates (40a, 41a) by wire-bonding.

Figure 2B:
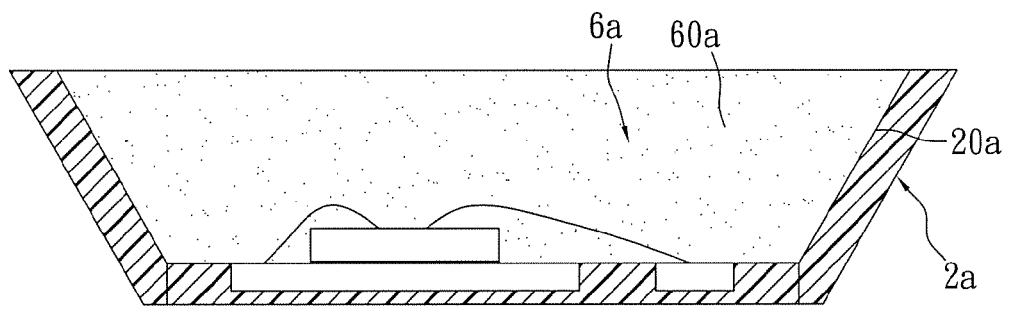

Step S104 is: referring to FIGS. 2 and 2B, filling a package colloid layer 6a with powder 60a (the package unit) into the receiving space 20a. In the first embodiment, the powder 60a can be phosphor powder, and the package colloid layer 6a can be silicone or epoxy. In addition, the package colloid layer 6a with the powder 60a can be filled into the receiving space 20a by dropping, press molding or spraying according to different requirements.

Figure 2C:
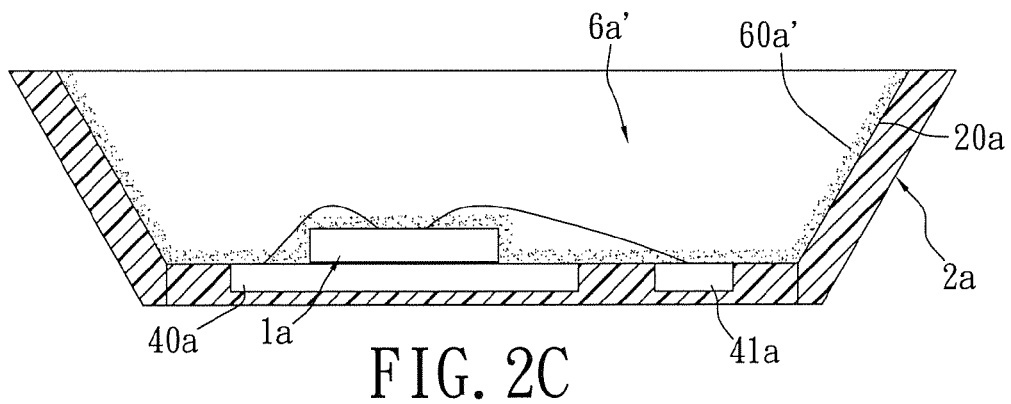

Step S106 is: referring to FIGS. 2 and 2C, maintaining the package colloid layer 6a with the powder 60a at room temperature in order to uniformly depositing the powder 60a' in the receiving space 20a. In other words, the powder 60a' can be deposited on the light-emitting element 1a, the two conductive substrates (40a, 41a) and an inner surface of the package body 2a. In addition, the room temperature is defined as 13-25° C., and the package colloid layer 6a is maintained at 1-168 hours according the properties of the package colloid layer 6a.

Step S108 is: heating the package colloid layer 6a' with the powder 60a' in order to solidify the package colloid layer 6a' with the powder 60a' in the receiving space 20a. The heating step includes the following two methods according to different manufacturing requirements:

1. The step of heating the package colloid layer 6a' is a one-step heating process that includes a heating temperature of 80~150° C. and a heating time of 1~6 hours.

2. The step of heating the package colloid layer 6a' is a two-step heating process that includes a first-step heating process and a second-step heating process, the first-step heating process has a heating temperature of 30~100° C. and a heating time of 10~120 minutes, and the second-step heating process has a heating temperature of 80~150° C. and a heating time of 1~6 hours.

In other words, the package colloid layer 6a with the powder 60a is fully deposited firstly as shown in FIG. 2B, and then the package colloid layer 6a' with the powder 60a' is heated as shown in FIG. 2C, in order to make the powder 60a be fully deposited as the powder 60a' on the inner surface of the package body 2a. Hence, the present invention can prevent non-deposited powder from be solidified in the inner surface of the package body 2a.

Referring to FIG. 2C, the first embodiment of the present invention provides an LED chip package structure using sedimentation, including: at least one light-emitting element 1a, a package body 2a, at least two conductive substrates (40a, 41a), and a package unit. The package body 2a has a receiving space 20a. The two conductive substrates (40a, 41a) are received in the receiving space 20a. The light-emitting element 1a is received in the receiving space 20a and electrically connected to the two conductive substrates (40a, 41a). The package unit has a package colloid layer 6a' and a powder 60a' mixed into the package colloid layer 6a'. The package unit is filled into the receiving space 20a, and the powder 60a' are uniformly deposited in the receiving space 20a by maintaining the package unit at room temperature firstly and the powder 60a' are solidified in the receiving space 20a by heating to a predetermined temperature.

Referring to FIGS. 3 and 3A to 3C, the steps of S200 to S202 in the second embodiment are the same as the steps of S100 to S102 in the first embodiment.

Figure 3:
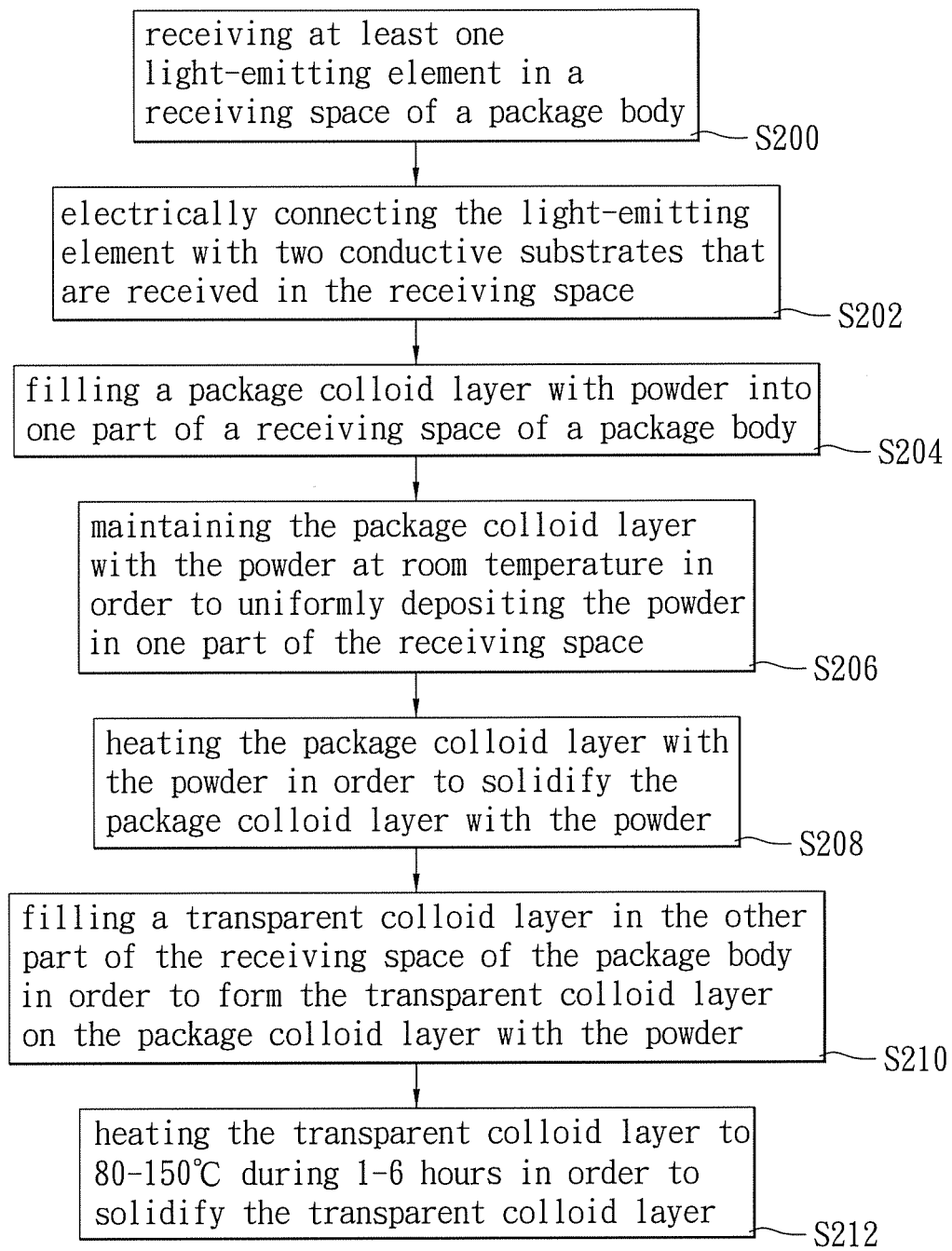
FIG. 3 is a flowchart of a method for making an LED chip package structure using sedimentation according to the second embodiment of the present invention.
Figure 3A:
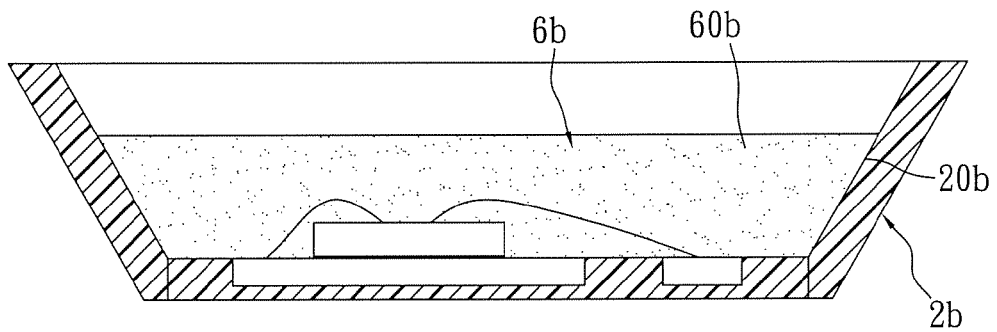
FIGS. 3A to 3C are cross-sectional views of an LED chip package structure using sedimentation according to the second embodiment of the present invention, at different stages of the packaging processes, respectively.

Moreover, after the step of S202, the second embodiment of the present invention further includes the following steps:

Step S204 is: referring to FIGS. 3 and 3A, filling a package colloid layer 6b with powder 60b into one part of a receiving space 20b of a package body 2b.

Figure 3B:
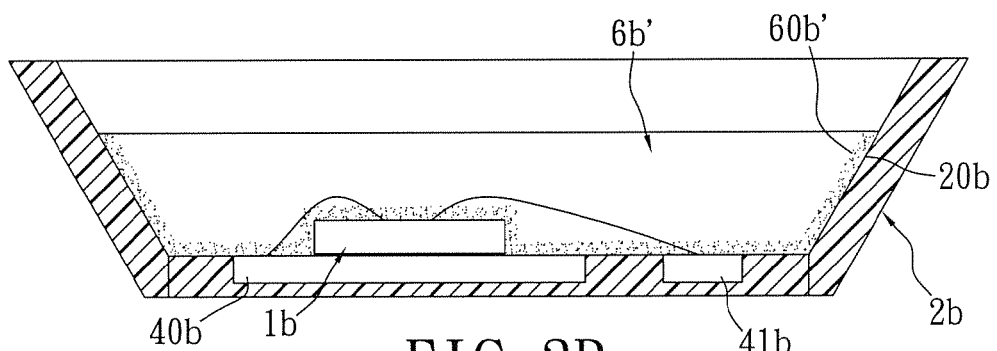

Step S206 is: referring to FIGS. 3 and 3B, maintaining the package colloid layer 6b with the powder 60b at room temperature in order to uniformly depositing the powder 60b' in one part of the receiving space 20b. In other words, the powder 60b' can be deposited on a light-emitting element 1b, two conductive substrates (40b, 41b) and an inner surface of the package body 2b. In addition, the room temperature is defined as 13-25° C., and the package colloid layer 6b is maintained at 1-168 hours according the properties of the package colloid layer 6b.

Step S208 is: heating the package colloid layer 6b' with the powder 60b' in order to solidify the package colloid layer 6b' with the powder 60b'. In other words, the package colloid layer 6b with the powder 60b is fully deposited firstly as shown in FIG. 3A, and then the package colloid layer 6b' with the powder 60b' is heated as shown in FIG. 3B, in order to make the powder 60b be fully deposited as the powder 60b' on one part of the inner surface of the package body 2b. Hence, the present invention can prevent non-deposited powder from be solidified in the inner surface of the package body 2b.

Figure 3C:
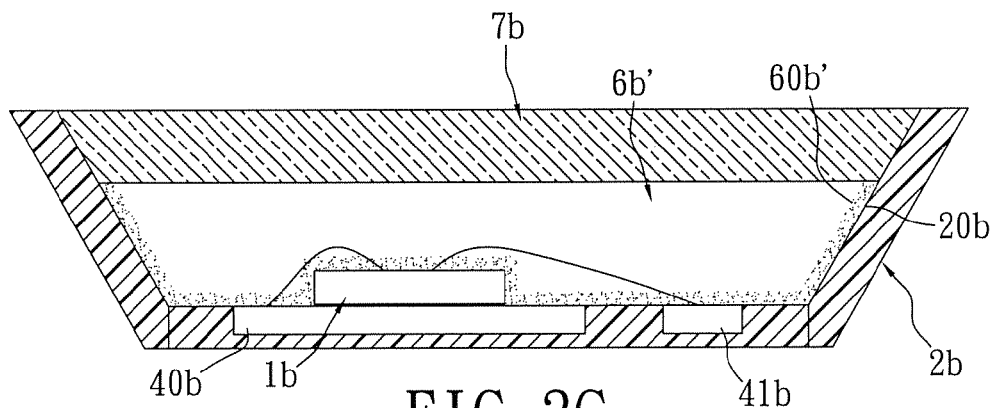

Step S210 is: referring to FIGS. 3 and 3C, filling a transparent colloid layer 7b in the other part of the receiving space 20b of the package body 2b in order to form the transparent colloid layer 7b on the package colloid layer 6b' with the powder 60b'.

Step S212 is: heating the transparent colloid layer 7b to 80-150° C. during 1-6 hours in order to solidify the transparent colloid layer 7b.

Referring to FIG. 3C, the second embodiment of the present invention provides an LED chip package structure using sedimentation, including: at least one light-emitting element 1b, a package body 2b, at least two conductive substrates (40b, 41b), and a package unit. The package body 2b has a receiving space 20b. The two conductive substrates (40b, 41b) are received in the receiving space 20b. The light-emitting element 1b is received in the receiving space 20b and electrically connected to the two conductive substrates (40b, 41b). The package unit has a package colloid layer 6b' and a powder 60b' mixed into the package colloid layer 6b'. The package unit is filled into the receiving space 20b, and the powder 60b' are uniformly deposited in the receiving space 20b by maintaining the package unit at room temperature firstly and the powder 60b' are solidified in the receiving space 20b by heating to a predetermined temperature. In addition, the package unit has a transparent colloid layer 7b received in the receiving space 20b, the light-emitting element 1b is covered by the package colloid layer 6b' with the powder 60b', and the transparent colloid layer 7b is disposed on the package colloid layer 6b' in order to protect the package colloid layer 6b'.

Referring to FIGS. 4 and 4A to 4C, the steps of S300 to S302 in the third embodiment are the same as the steps of S100 to S102 in the first embodiment.

Figure 4:
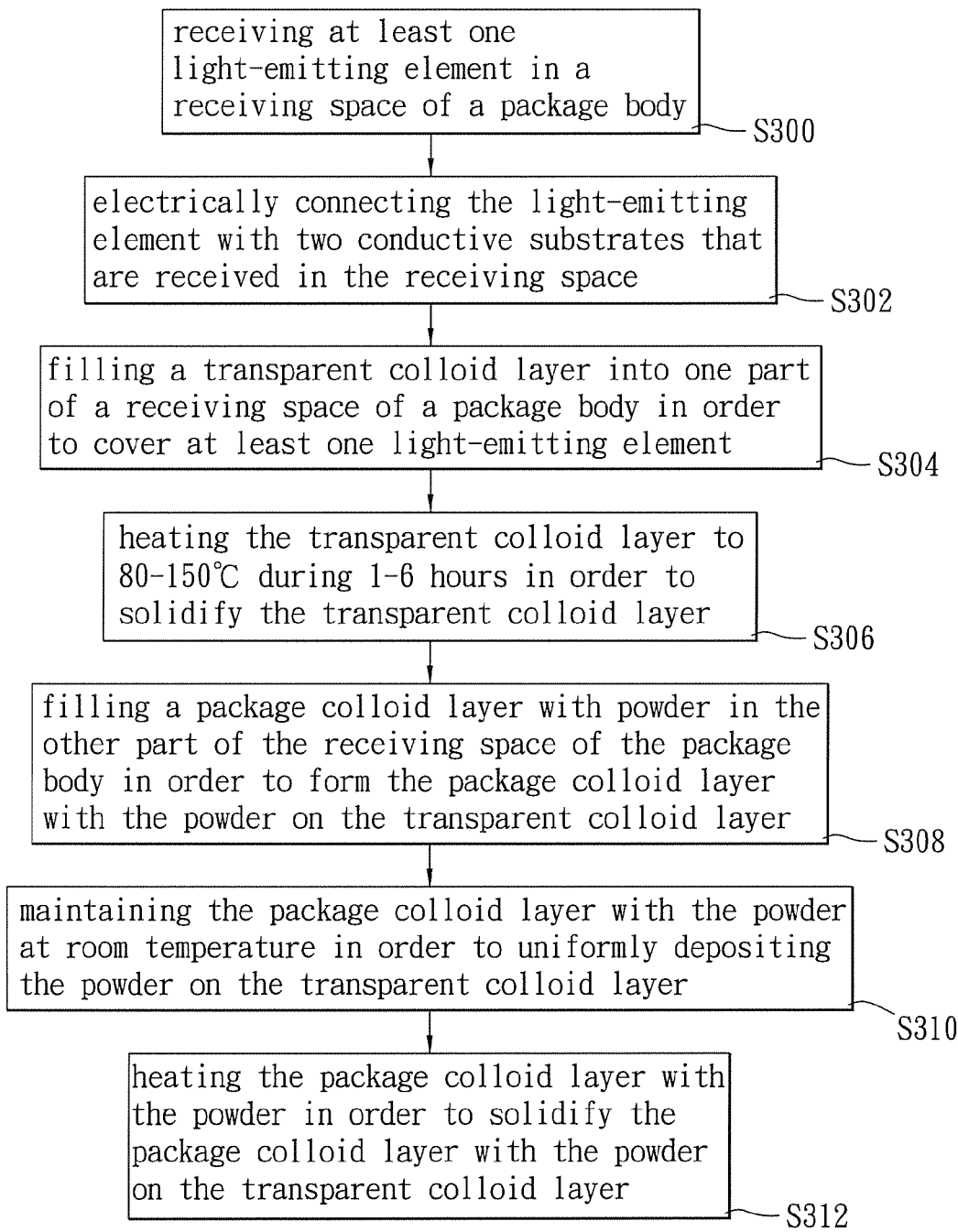
FIG. 4 is a flowchart of a method for making an LED chip package structure using sedimentation according to the third embodiment of the present invention.
Figure 4A:
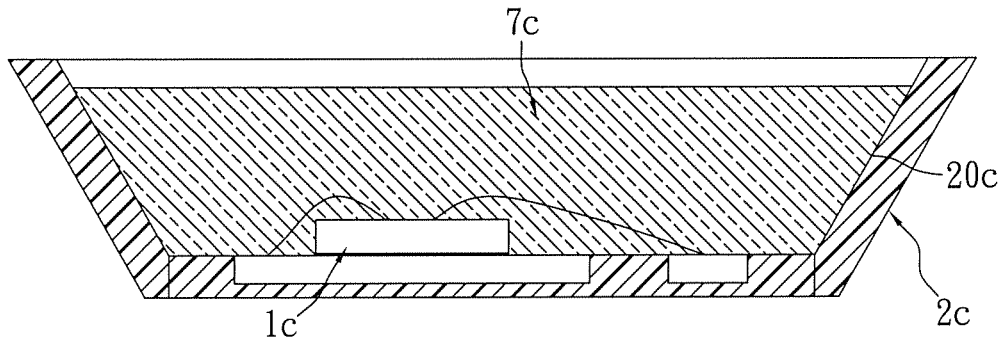
FIGS. 4A to 4C are cross-sectional views of an LED chip package structure using sedimentation according to the third embodiment of the present invention, at different stages of the packaging processes, respectively.

Moreover, after the step of S302, the third embodiment of the present invention further includes the following steps:

Step S304 is: referring to FIGS. 4 and 4A, filling a transparent colloid layer 7c into one part of a receiving space 20c of a package body 2c in order to cover at least one light-emitting element 1c.

Step S306 is: heating the transparent colloid layer 7c to 80-150° C. during 1-6 hours in order to solidify the transparent colloid layer 7c.

Figure 4B:
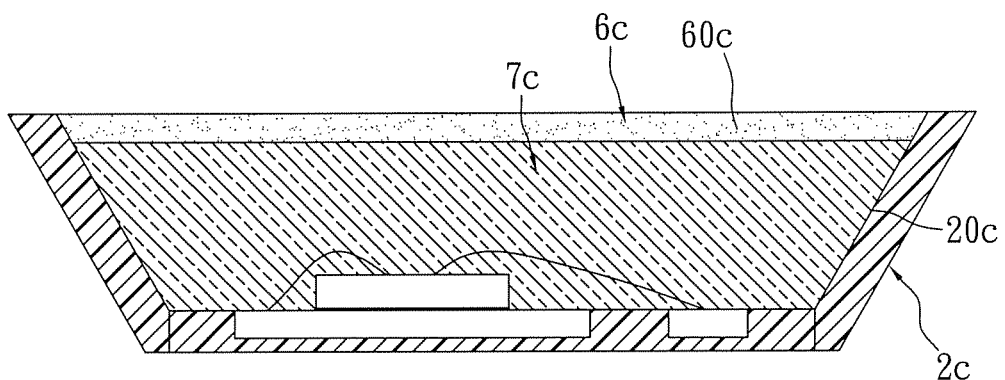

Step S308 is: referring to FIGS. 4 and 4B, filling a package colloid layer 6c with powder 60c in the other part of the receiving space 20c of the package body 2c in order to form the package colloid layer 6c with the powder 60c on the transparent colloid layer 7c.

Figure 4C:
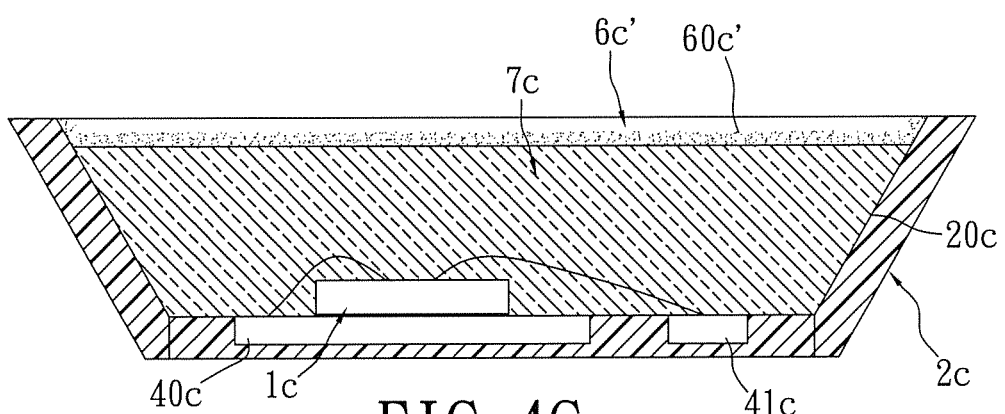

Step S310 is: referring to FIGS. 4 and 4C, maintaining the package colloid layer 6c with the powder 60c at room temperature in order to uniformly depositing the powder 60c' on the transparent colloid layer 7c. In addition, the room temperature is defined as 13-25° C., and the package colloid layer 6c is maintained at 1-168 hours according the properties of the package colloid layer 6c.

Step S312 is: heating the package colloid layer 6c' with the powder 60c' in order to solidify the package colloid layer 6c' with the powder 60c' on the transparent colloid layer 7c. In other words, the package colloid layer 6c with the powder 60c is fully deposited firstly as shown in FIG. 4C, and then the package colloid layer 6c' with the powder 60c' is heated as shown in FIG. 4C, in order to make the powder 60c be fully deposited as the powder 60c' on the transparent colloid layer 7c and on the other part of the inner surface of the package body 2c. Hence, the present invention can prevent non-deposited powder from be solidified on the transparent colloid layer 7c and on the other part of the inner surface of the package body 2c.

Referring to FIG. 4C, the third embodiment of the present invention provides an LED chip package structure using sedimentation, including: at least one light-emitting element 1c, a package body 2c, at least two conductive substrates (40c, 41c), and a package unit. The package body 2c has a receiving space 20c. The two conductive substrates (40c, 41c) are received in the receiving space 20c. The light-emitting element 1c is received in the receiving space 20c and electrically connected to the two conductive substrates (40c, 41c). The package unit is filled into the receiving space 20c, and the package unit has a transparent colloid layer 7c received in the receiving space 20c. The light-emitting element 1c is covered by the transparent colloid layer 7c. In addition, the package unit has a package colloid layer 6c' and a powder 60c' mixed into the package colloid layer 6c', and the package colloid layer 6c' with the powder 60c' is disposed on the transparent colloid layer 7c in order to prevent the quality of the package colloid layer 6c' from being affected by heat generated by the light-emitting element 1c. Furthermore, the powder 60c' are uniformly deposited in the receiving space 20c by maintaining the package unit at room temperature firstly and the powder 60c' are solidified in the receiving space 20c and on the transparent colloid layer 7c by heating to a predetermined temperature.

Figure 5A:
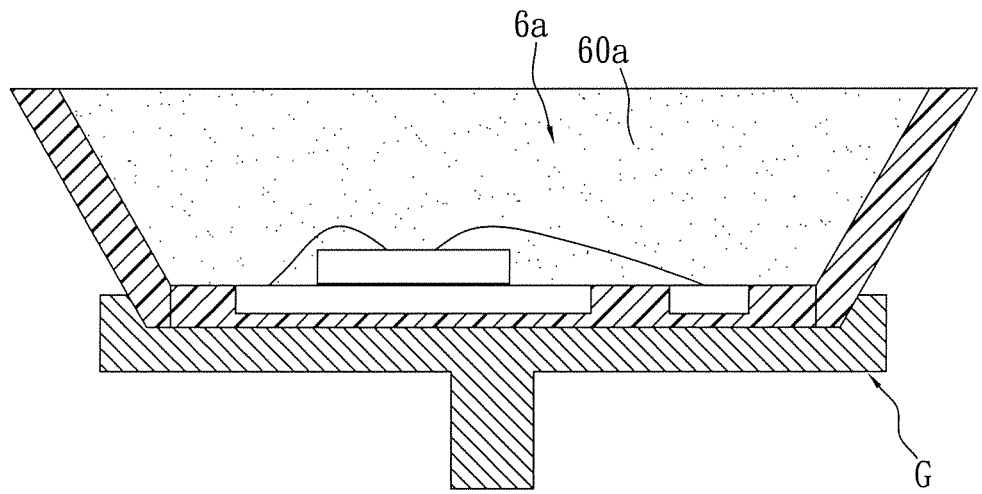
FIGS. 5A and 5B are schematic views of a first method for depositing the powder according to the present invention, respectively.
Figure 5B:
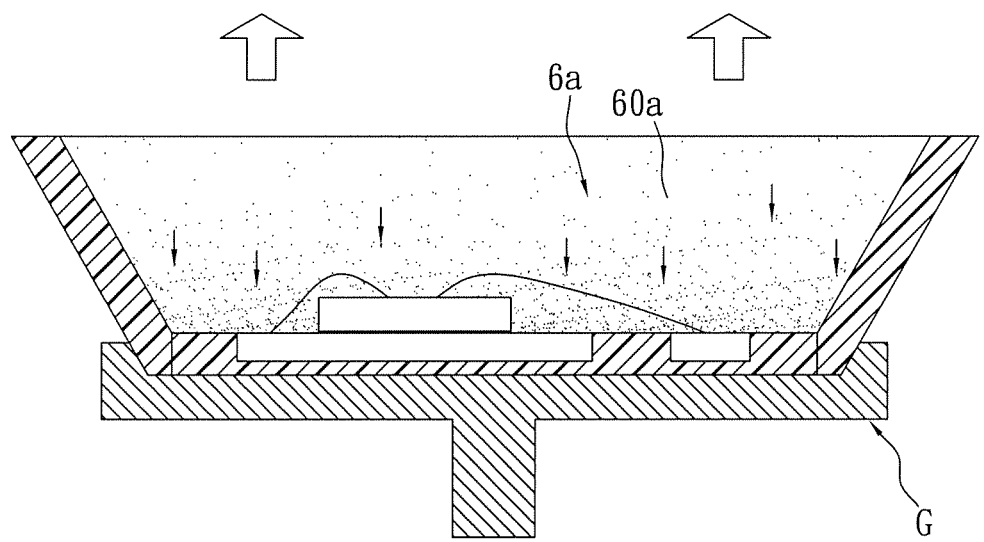

Referring to FIGS. 5A and 5B, for example in the first embodiment, the step of maintaining the package colloid layer with the powder in the room temperature further includes: the powder 60a of the package colloid layer 6a are deposited quickly by using a gravity device G (as shown in FIG. 5A) to move upwards the package body 2a quickly.

Figure 6A:
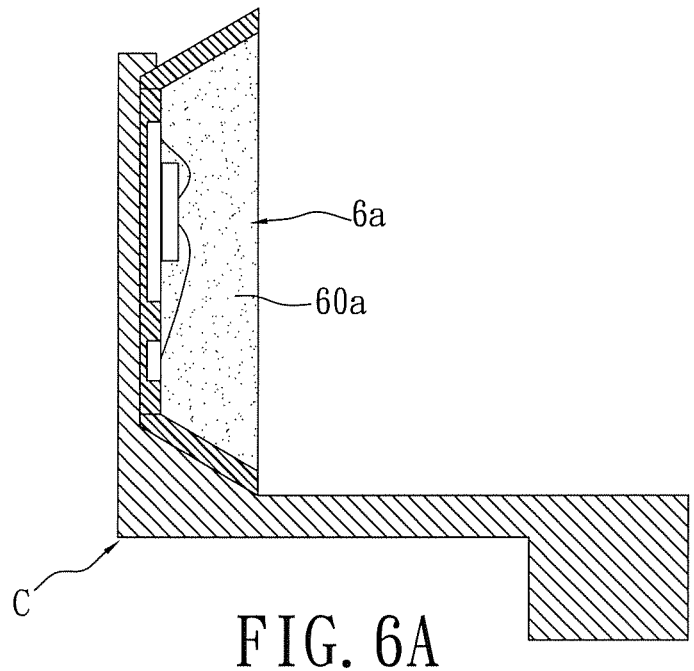
FIGS. 6A and 6B are schematic views of a second method for depositing the powder according to the present invention, respectively.
Figure 6B:
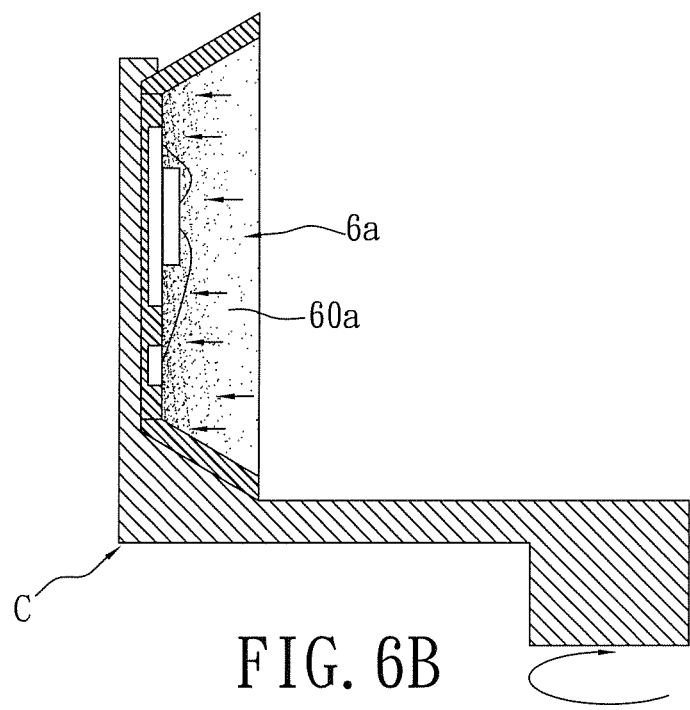

Referring to FIGS. 6A and 6B, for example in the first embodiment, the step of maintaining the package colloid layer with the powder in the room temperature further includes: the powder 60a of the package colloid layer 6a is deposited quickly by using a centrifugal device C to rotate the package body quickly.

Figure 7A:
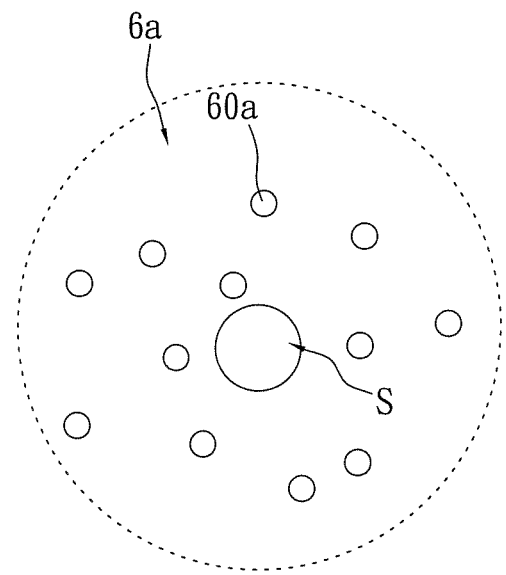
FIGS. 7A and 7B are schematic views of a third method for depositing the powder according to the present invention, respectively.
Figure 7B:
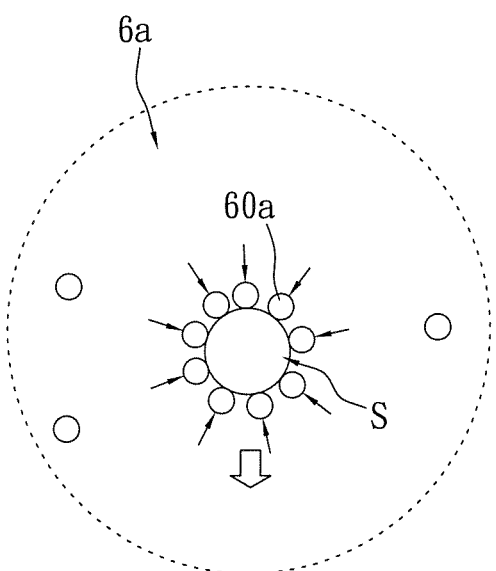

Referring to FIGS. 7A and 7B, for example in the first embodiment, the step of maintaining the package colloid layer with the powder in the room temperature further includes: the powder 60a are deposited quickly by adding surface-action agents S into the package colloid layer 6a in order to drag downwards the powder 60a quickly.

In conclusion, because the powder of the present invention can be fully deposited on the inner surface of the package body, "the condensing capability" and "the color and luster" of the present invention are good and uniform. In other words, the powder of the present invention can be fully deposited on the inner surface of the package body, so that light generated by the light-emitting elements can pass through the uniform package colloid layer to project uniform light beams out. Hence, the present invention can generate a best light-projecting quality.

Therefore, the package colloid layer with the powder is fully deposited firstly, and then the package colloid layer with the powder is heated, in order to make the powder be fully deposited in the receiving space of the package body. Hence, the present invention can prevent non-deposited powder from be solidified in the receiving space of the package body. In addition, the curing time can be decreased, so that the usage life of the package colloid layer with the powder is increased.

Furthermore, the present invention has the following three deposition types according to different light-projecting properties and package structures 1. First type is a single deposition as the first embodiment. The advantage is: the manufacture process is simple.
2. Second type is a dual-layer structure with an inner deposition as the second embodiment. The advantage is: the dual-layer structure has two colloid layers that have the same or different physical property and chemical property such as adhesiveness, hardness or refractive index etc. In addition, the optical quality and the package structure of the second type are good.
3. Third type is a dual-layer structure with an outer deposition as the third embodiment. The advantage is: the package colloid layer is disposed on the transparent colloid layer in order to prevent the quality and the usage life of the package colloid layer from being affected (decreased) by heat generated by the light-emitting element.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for making an LED chip package structure using sedimentation, comprising:

receiving at least one light-emitting element in a receiving space of a package body;

electrically connecting the light-emitting element with two conductive substrates that are received in the receiving space;

filling a package colloid layer with powder into the receiving space; and maintaining the package colloid layer with the powder at room temperature in order to uniformly depositing the powder in the receiving space, wherein before the step of filling the package colloid layer with the powder into the receiving space, the method further comprises:

filling a transparent colloid layer in the receiving space of the package body in order to cover the light-emitting element; and heating the transparent colloid layer to 80-150° C. during 1-6 hours in order to solidify the transparent colloid layer, wherein the package colloid layer is disposed on the transparent colloid layer.

2. The method as claimed in claim 1, wherein the light-emitting element is a blue LED, and the package body has a bowl shape.

3. The method as claimed in claim 2, wherein the light-emitting element is firmly fixed on the inner surface of the bowl-shaped package body via a chip-positioning layer formed between the light-emitting element and the package body.

4. The method as claimed in claim 3, wherein the chip-positioning layer is solidified by curing to 155° C. during 3 hours in order to firmly fix the light-emitting element on the inner surface of the bowl-shaped package body.

5. The method as claimed in claim 1, wherein the light-emitting element is electrically connected with the two conductive substrates by wire-bonding.

6. The method as claimed in claim 1, wherein the package colloid layer with the powder is filled into the receiving space by dropping, press molding or spraying.

7. The method as claimed in claim 1, wherein the powder is phosphor powder, and the package colloid layer is silicone or epoxy.

8. The method as claimed in claim 1, wherein the room temperature is defined as 13-25° C., and the package colloid layer is maintained at 1-168 hours according the properties of the package colloid layer.

9. The method as claimed in claim 1, wherein after the step of maintaining the package colloid layer, the method further comprises heating the package colloid layer with the powder in order to solidify the package colloid layer with the powder in the receiving space.

10. The method as claimed in claim 9, wherein the step of heating the package colloid layer is a one-step heating process that includes a heating temperature of 80~150° C. and a heating time of 1~6 hours.

11. The method as claimed in claim 9, wherein the step of heating the package colloid layer is a two-step heating process that includes a first-step heating process and a second-step heating process, the first-step heating process has a heating temperature of 30~100° C. and a heating time of 10~120 minutes, and the second-step heating process has a heating temperature of 80~150° C. and a heating time of 1~6 hours.

12. The method as claimed in claim 1, wherein the step of maintaining the package colloid layer with the powder in the room temperature further comprises: depositing the powder quickly by adding surface-action agents into the package colloid layer in order to drag downwards the powder quickly.

* * * * *